Figure 1:
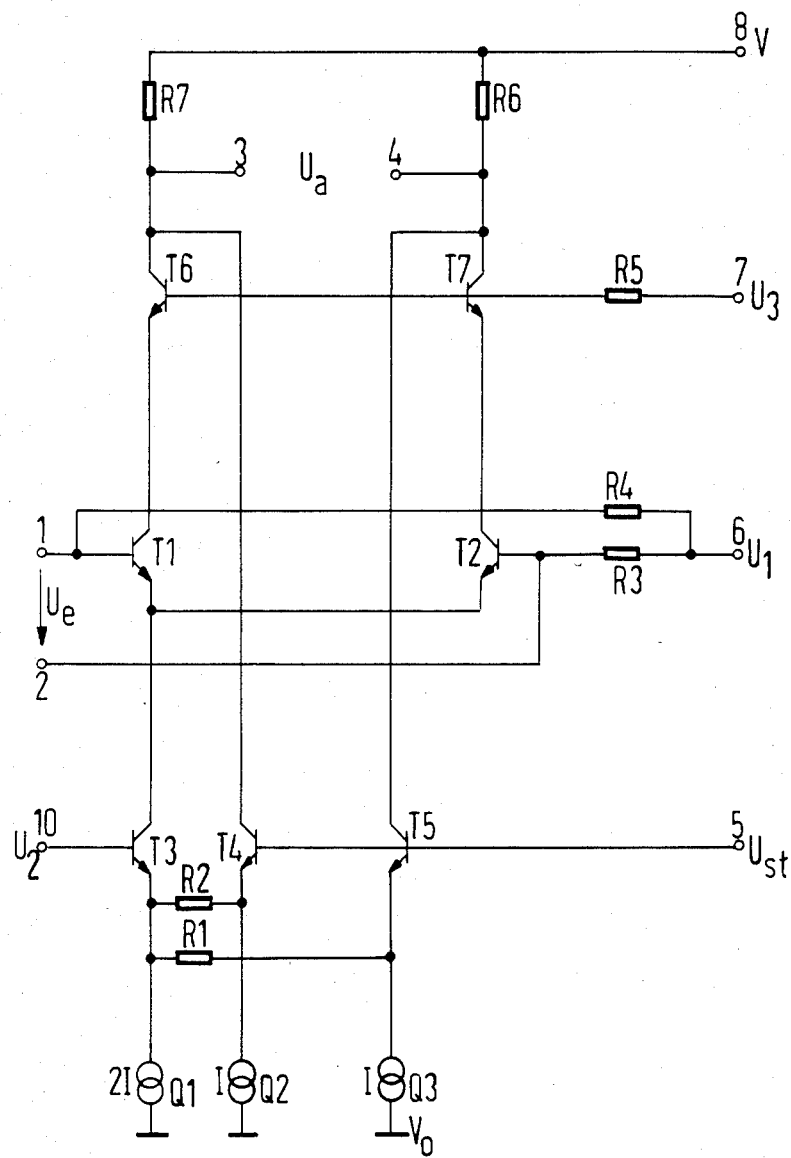

ent [19] [11] Patent Number: 4,504,794
Fenk [45] Date of Patent: Mar. 12, 1985

[54] INTEGRABLE DIFFERENTIAL AMPLIFIER

[75] Inventor: Josef Fenk, Eching/Ottenburg, Fed. Rep. of Germany

[73] Assignee: Siemens Aktiengesellschaft, Berlin and Munich, Fed. Rep. of Germany

[21] Appl. No.: 463,914

[22] Filed: Feb. 4, 1983

[30] Foreign Application Priority Data

Feb. 9, 1982 [DE] Fed. Rep. of Germany ....... 3204430

[51] Int. Cl.³ .............................................. H03F 3/45
[52] U.S. Cl. ..................................... 330/254; 330/261
[58] Field of Search ......................... 330/252, 254, 261

[56] References Cited

U.S. PATENT DOCUMENTS 4,139,824  2/1979  Ohsawa ............................... 330/254
4,427,949  1/1984  Yamaguchi et al. ............ 330/252 X Primary Examiner—James B. Mullins
Assistant Examiner—Steven J. Mottola
Attorney, Agent, or Firm—Herbert L. Lerner; Laurence A. Greenberg

[57] ABSTRACT

Integrable differential amplifier having a d-c voltage source delivering a reference potential and a supply potential wherein a first and a second transistor forming a differential amplifier unit have a respective emitter by which they are connected in common with a collector of a third transistor, the first and second transistors having respective base terminals forming respective signal input terminals and being connected via a respective resistance to a common first auxiliary potential, the first transistors and the second transistor having respective collectors, each of which, through the intermediary of a ballast resistance connected to the supply potential and a terminal appertaining to the ballast resistance of the respective first and second transistors, being directly connected, respectively, to a signal output terminal of the amplifier, the respective emitters of the first and second transistors being connected to the reference potential via the emitter of the third transistors, the third transistor having a base to which a second auxiliary potential is applied, including a fourth and fifth transistor having respective emitters connected together with the emitter of the third transistor to the reference potential via a respective constant current source, the fourth and fifth transistors having respective bases to which a control signal related to the reference potential is applied in common, the emitter of the fourth transistor and the emitter of the fifth transistor being connected to the emitter of the third transistor, the fourth and the fifth transistors having respective collectors which, with respect to a respective branch of the differential amplifier unit controlled by the collector of the first transistor and by the second transistor, respectively, are connected in such manner to the differential amplifier unit that a current flowing through the ballast resistance associated with the first transistor is affected by a collector current of the fourth transistor, and that a current flowing through the ballast resistance associated with the second transistor is affected by a collector current of the fifth transistor, the collectors of the fourth and the fifth transistors having no direct connection with the connected emitters of the first and second transistors.

4 Claims, 4 Drawing Figures

INTEGRABLE DIFFERENTIAL AMPLIFIER

The invention relates to an integrable differential amplifier and, more particularly, to such an integrable differential amplifier having a d-c voltage source delivering a reference potential as well as a supply potential, wherein a first and a second transistor forming the actual differential amplifier have a respective emitter by which they are connected in common with a collector of a third transistor, the first and second transistors having respective base terminals forming respective signal input terminals and being connected via a respective resistance to a common first auxiliary potential, the first transistor and the second transistor having a respective collector, each thereof, through the intermediary of a ballast resistance connected to the supply potential and a terminal appertaining to the ballast resistance of the respective first and second transistors being directly connected, respectively, to a signal output terminal of the amplifier, the respective emitters of the first and second transistors being connected to the reference potential via the emitter of the third transistor, the third transistor having a base to which a second auxiliary potential is applied.

Such a differential amplifier, for example, forms the core of an oscillator circuit according to FIG. 1 of my co-pending application Ser. No. 313,629 filed Oct. 21, 1981. In addition to the foregoing features of a conventional differential amplifier, the differential amplifier according to the invention is provided with a control by means of a resonant circuit and a resonant crystal, respectively, and a feedback. However, it should be noted that such a differential amplifier can also be used as a signal amplifier, if it is controlled correspondingly.

It is an object of the invention to provide an amplifier, which delivers into the UHF-range a maximum amplification of the respective applied signals with a high or large automatic gain control of the amplifier.

With the foregoing and other objects in view, there is provided, in accordance with the invention an integrable differential amplifier having a d-c voltage source delivering a reference potential and a supply potential wherein a first and a second transistor forming a differential amplifier unit have a respective emitter by which they are connected in common with a collector of a third transistor, the first and second transistors having respective base terminals forming respective signal input terminals and being connected via a respective resistance to a common first auxiliary potential, the first transistor and the second transistor having respective collectors, each of which, through the intermediary of a ballast resistance connected to the supply potential and a terminal appertaining to the ballast resistance of the respective first and second transistors, being directly connected, respectively, to a signal output terminal of the amplifier, the respective emitters of the first and second transistors being connected to the reference potential via the emitter of the third transistor, the third transistor having a base to which a second auxiliary potential is applied, comprising a fourth and a fifth transistor having respective emitters connected together with the emitter of the third transistor to the reference potential via a respective constant current source, the fourth and the fifth transistors having respective bases to which a control signal related to the reference potential is applied in common, the emitter of the fourth transistor and the emitter of the fifth transistor being connected to the emitter of the third transistor, the fourth and the fifth transistors having respective collectors, which with respect to a respective branch of the differential amplifier unit controlled by the collector of the first transistor and by the second transistor, respectively, are connected in such manner to the differential amplifier unit that a current flowing through the ballast resistance associated with the first transistor is affected by a collector current of the fourth transistor, and that a current flowing through the ballast resistance associated with the second transistor is affected by a collector current of the fifth transistor, the collectors of the fourth and the fifth transistors having no direct connection with the connected emitters of the first and second transistors.

In accordance with a further feature of the invention, the emitters of the fourth and the fifth transistors being connected via the last-mentioned resistances, respectively, to the emitter of the third transistor.

In accordance with an additional feature of the invention, a sixth transistor via which the collector of the first transistor is connected to an output terminal of the differential amplifier unit associated therewith, and a seventh transistor via which the collector of the second transistor is connected to an output terminal of the differential amplifier unit associated therewith, both of the sixth and the seventh transistors operating in a respective cascode circuit and being controlled by a third auxiliary potential.

In accordance with an added feature of the invention, the first and the second transistors are npn-transistors.

In accordance with yet another feature of the invention, a common resistance via which the third auxiliary potential is applied to the sixth and the seventh transistors, respectively.

In accordance with yet a further feature of the invention, the sixth transistor has a collector connected to the collector of the fourth transistor, and the seventh transistor has a collector connected to the collector the the fifth transistor.

The various possibilities for connecting the fourth and the fifth transistors for influencing or affecting the current flowing through the ballast resistances are shown and described hereinafter. In all of these cases, the hereinaforementioned cascode stage is provided. Except for the last embodiment of the invention shown and described hereinafter, the cacode stage may be omitted. Of course it should be noted that the presence of the cascode stage aids markedly in further improvement of the amplifier according to the invention.

Other features which are considered as characteristic for the invention are set forth in the appended claims.

Although the invention is illustrated and described herein as embodied in an integrable differential amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIGS. 1 to 4 are circuit diagrams of four different embodiments, respectively, of the integrable differential amplifier according to the invention.

Like parts are identified by the same reference characters in all of the figures. In all of the embodiments, all of the transistors are of the npn-type, however, it is obviously possible to substitute pnp-type transistors therefor. Furthermore, instead of bipolar transistors, MOS field effect transistors may also be used, for example, or junction field effect transistors.

In the circuits of the amplifier according to the invention represented in the four figures, the core of the circuit, which forms the differential amplifier is made up of two transistors T1 and T2 having respective emitters which are directly connected to one another. The base of the one transistor T1 is connected to a signal input terminal 1 as well as via a resistance R4 to a terminal 6 for a first auxiliary potential $U_1$. The base of the second transistor T2 is connected to the second input terminal 2 for an input signal $U_e$ to be amplified and also via a resistance R3 to the just-mentioned first auxiliary potential $U_1$. The auxiliary potential $U_1$ as well as all the remaining auxiliary potentials $U_2$, $U_3$ and the control signal $U_{st}$ are related to the reference potential $V_o$ ground, and can, for example, be given through one pole of another direct-current source, the other pole of which is connected to the reference potential $U_o$. Also, shunting of the auxiliary potentials is possible, for example, by voltage division of the supply voltage which is delivered by the supply voltage source (not illustrated in the figures) and defined by the reference potential $V_o$ and another supply potential V.

The emitter of the first transistor and the emitter of the second transistor i.e. thus the emitters of the transistors T1 and T2, are connected to the collector of the third transistor T3, the second auxiliary potential $U_2$ is applied through an input 10 to the base of the transistor T3, and the emitter of the third transistor T3 is connected with an output of a first constant current source Q1. The emitter of the third transistor T3 is, moreover, connected to the emitter of the fifth transistor T5 via a resistance R1, and the emitter of the fourth transistor T4 is connected to the emitter of the third transistor T3 via the resistance R2. If necessary or desirable, the connection between the emitter of the first transistor T1 and the emitters of the fourth and the fifth transistors T4 and T5 can be effected directly.

The emitter of the fourth transistor T4 and the emitter of the fifth transistor T5 are connected to the reference potential $V_o$ via respective constant current sources Q2 and Q3. The constant current sources Q1, Q2 and Q3 can be provided, for example, in a conventional manner as npn-transistors connected as a constant current source. Another possibility exists, in that the individual current sources Q1, Q2 and Q3 be replaced by conventional current reflecting or mirror circuits.

As is apparent from the figures, the constant current source Q1 for supplying the third transistor T3, and the constant current sources Q2 and Q3 for supplying the fourth and fifth transistors T4 and T5 are constructed so that they, respectively, deliver the same current I to the respective transistors T4 and T5, while the current, which the third transistor T3 receives from the constant current source Q1 belonging thereto, is twice as large. As mentioned hereinbefore the third transistor T3, is controlled at its base by the second auxiliary potential $U_2$, while the base terminals of the fourth and fifth transistors T4 and T5 are controlled together by a control signal $U_{st}$ related to the reference potential $V_o$.

The collectors of the two transistors forming the actual differential amplifier or, in other words, the collectors of the first and second transistors T1 and T2, are connected, in the simplest case, as established hereinabove, directly to a respective output terminal 3 and 4, as well as via a ballast resistance R7 and R6, respectively, to the supply potential V which is connected to the supply terminal 8.

In the embodiments of the amplifier according to the invention represented in FIGS. 1 to 4, on the other hand, the collector of the first transistor T1 is connected to the emitter of a transistor T6, and the collector of the second transistor T2 of the differential amplifier is connected to the emitter of a transistor T7, which form a cascode stage and, at the bases thereof, have applied thereto in common a third auxiliary voltage $U_3$ via a terminal 7. Preferably, control of the sixth and seventh transistors T6 and T7 is effected via a common resistance R5. When the two transistors T6 and T7 are present, the collector of the first and of the second transistors T1 and T2 are not connected, but rather, the collector of the sixth transistor T6, on the one hand, and the collector of the seventh transistor, on the other hand, are connected to output terminals 3 and 4, respectively, for the purpose of producing the output voltage $U_a$, on the one hand and, on the other hand, are connected with resistances R6 and R7, respectively, to the terminal 8 for the supply potential V.

It is important for the invention that the collector of the fourth transistor T4 and the collector of the fifth transistor T5 are connected together, in such manner, with a respective one of the two branches of the differential amplifier that, due to the effect thereof, the output signal $U_a$ at the terminals 3 and 4 is improved, which would not occur in the absence of the two transistors T4 and T5. Because of this, it is important that no direct connection exist between the collectors of the fourth transistor T4 and the fifth transistor T5 and the collector of the third transistor T3, and accordingly, with the mutually coupled emitters of the two transistors T1 and T2 of the differential amplifier, as provided in the invention.

In the embodiment of an amplifier according to the invention represented in FIG. 1, the collector of the fourth transistor T4 is connected to the collector of the sixth transistor T6 and, accordingly, to the output terminal 3, while the collector of the fifth transistor T5 is connected to the collector of the seventh transistor T7 and, accordingly, to the output terminal 4.

Figure 2:
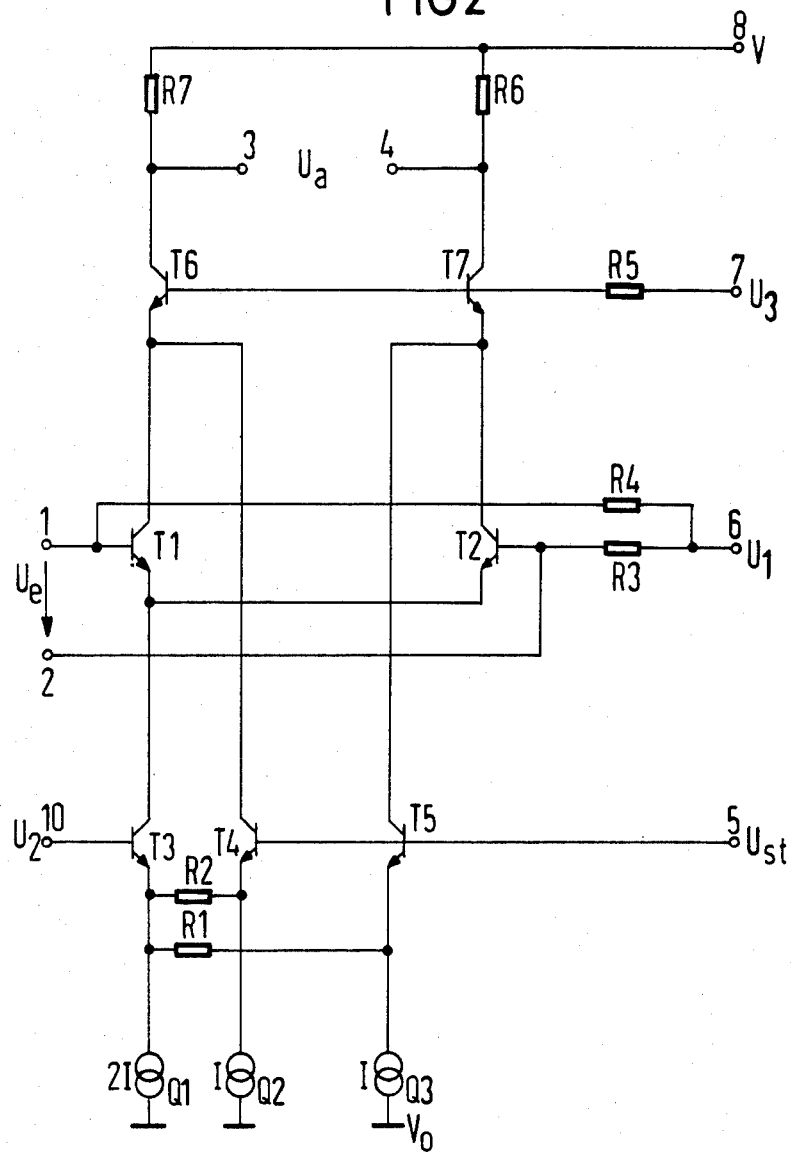

In the circuit shown in FIG. 2, control of the output signal by means of the fourth transistor T4 and the fifth transistor T5 is possible in that the collector of the first transistor T1 is directly connected to the collector of the fourth transistor T4, and the collector of the second transistor T2 of the differential amplifier is directly connected to the collector of the fifth transistor T5. Accordingly, the emitter of the sixth transistor T6 and the seventh transistor T7, respectively, are loaded simultaneously through the collector of the first transistor T1 and of the fourth transistor T4, on the one hand, and through the collector of the second transistor T2 and of the fifth transistor T5, on the other hand.

Figure 3:
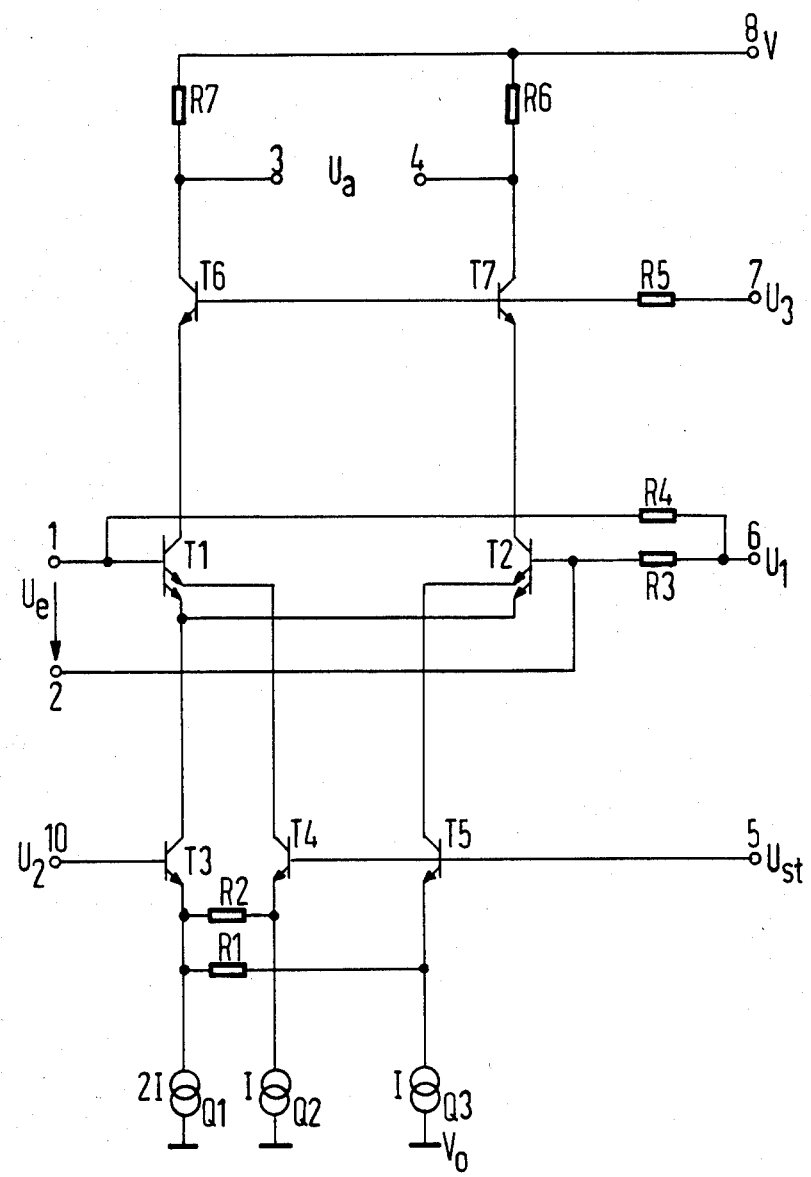

In the third embodiment of FIG. 3, the first transistor T1 and the second transistor T2 are formed as two-emitter transistors, respectively. This permits a respective one of the emitters of the first and of the second transistors T1 and T2 to be supplied in common through the collector of the transistor T3, respectively, in the usual manner for the differential amplifier, while the second emitter of the first transistor T1 is connected to the collector of the fourth transistor T4, and the second emitter of the second transistor T2 is connected to the collector of the fifth transistor T5.

Figure 4:
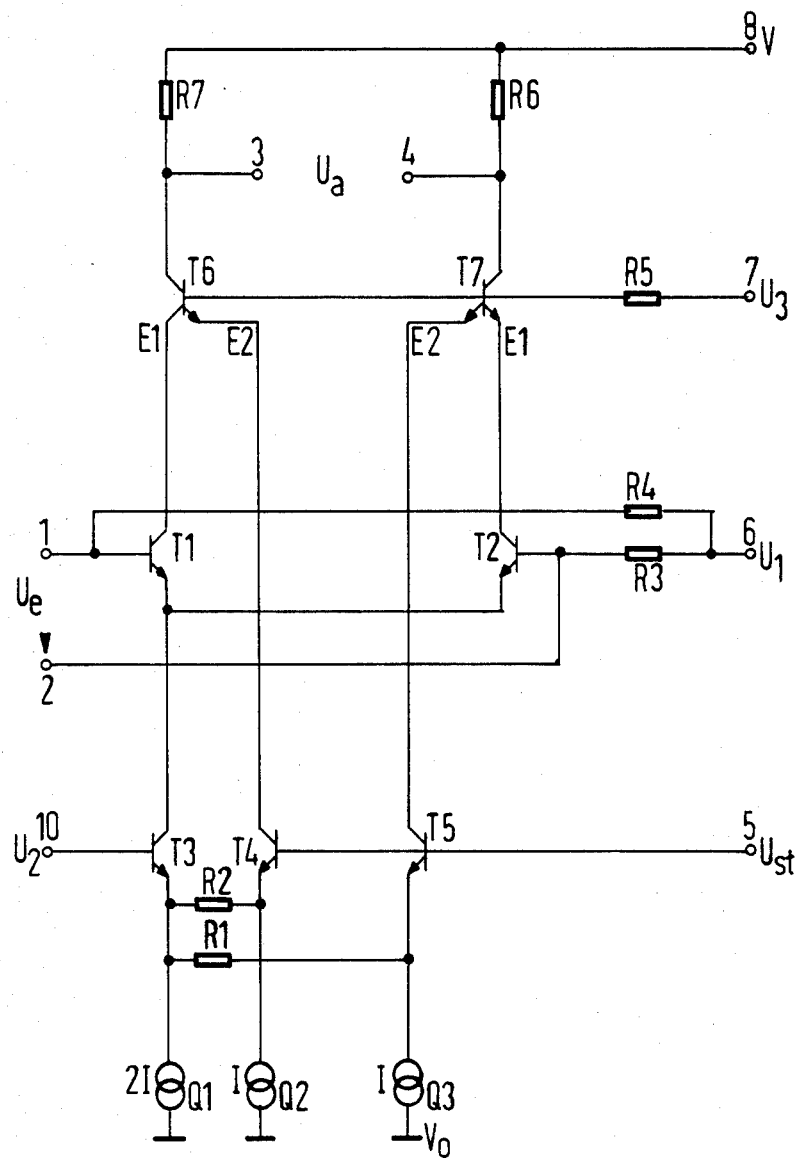

In the most advantageous solution according to FIG. 4, instead of the first two transistors T1 and T2, the sixth and the seventh transistor i.e. the transistor T6 and the transistor T7, are supplied with two emitters, respectively, one emitter of the sixth transistor T6 being loaded from the collector of the first transistor T1, and the other emitter of the sixth transistor T6 being loaded from the collector of the fourth transistor T4. Likewise, a first emitter of the seventh transistor T7 is connected to the collector of the second transistor T2, and the other second emitter of the seventh transistor T7 is connected to the collector of the fifth transistor T5.

In light of the foregoing description of the invention, and especially, of the detailed arrangement of developed circuits according to FIGS. 1 to 4, the following relationships occur:

If a symmetrical, especially high frequency information signal $U_e$ is applied to the input terminals 1 and 2, an additionally amplified output signal $U_a$ is received at the output terminals 3 and 4 through the first transistor T1, through the second transistor T2 and through the sixth and seventh transistors T6 and T7, if they are present. When the aforementioned transistors T1 to T7 and Q1 to Q3 are formed as npn-transistors, maximum amplification is received when the terminal 5, which conducts the control signal $U_{st}$, is more negative than the terminal 10, from which the second auxiliary potential $U_2$ is applied to the base of the third transistor T3 (related to ground, and thus to the auxiliary potential $V_o$) and, moreover, the third transistor T3 conducts the total current of all the current sources Q1, Q2 and Q3. The emitter of the first transistor T1 and of the second transistor T2 are connected together with as little resistivity as possible i.e. with a minimum of ohmic resistance so as to receive no perceptible emitter-inverse feedback. Because the real component of the output admittance of the first transistor T1 and of the second transistor T2 at high frequencies is of relatively low resistance and the allowable ballast resistance would be parasiticly reduced, the cascode stage presented by the sixth transistor T6 and the cascode-step presented by the seventh transistor T7 are provided in accordance with the further development of the invention shown in FIGS. 1 to 4, wherein the output resistance of the two cascode stages T6 and T7 is considerably greater than of the ballast resistances R6 and R7. Furthermore, the cascode stage presented by the sixth transistor T6 and by the seventh transistor T7 reduces the feedback from the output terminals 3 and 4 to the input 1 and 2 and increases the maximum amplification. The resistance R5, which passes on the third auxiliary potential $U_3$ to the base terminals of the two cascode transistors T6 and T7 via the terminal 7 is not absolutely necessary; the resistance R5, nevertheless, improves the symmetry of the output signal $U_a$, received on terminals 3 and 4.

A control voltage $U_{st}$ is applied to the base terminals of the fourth and fifth transistors T4 and T5 in a manner that the flow of current is instituted actually via the fourth and the fifth transistors T4 and T5, respectively, and thus on the one hand, the high frequency amplification is thereby reduced on the way from the signal input 1, 2 to the signal output 3, 4 and, on the other hand, the direct-current operating point at the output terminals 3 and 4 is not affected because the current derived from the third transistor T3, flows via the collectors of the fourth and fifth transistors T4 and T5, because of each circuit satisfying the invention, again to the ballast resistances R7 and R6, respectively, connecting the fourth and the fifth transistors T4 and T5 on the collector side with the supply potential.

All the amplifier circuits according to the invention and especially those represented in FIGS. 1 to 4 have an advantage with respect to conventional amplifier circuits, that due to the direct emitter coupling between the first transistor T1 and the second transistor T2, and because of the differential amplifier circuit, maximum possible amplification is attainable, the d-c voltage operating point at the terminals 3 and 4 remaining always constant and independent of the control voltage $U_{st}$ at the terminal 5. With regard to the amplification of the output signal $U_a$, a further improvement is achieved through the cascode transistors T6 and T7.

Due to the development of the amplifier circuit according to the invention shown in FIGS. 3 and 4, what has been achieved is that the collector outputs of the fourth and the fifth transistor T4 and T5 are not disposed in the high-frequency signal path in the amplifier circuit, however, in the circuits shown in FIGS. 1 and 2, this is not the case, so that in the circuits according to FIGS. 3 and 4, the transistors T4 and T5 do not cause any reduction in the amplification.

The embodiment of the amplifier circuit according to the invention represented in FIG. 3 is less optimal than the embodiment thereof represented in FIG. 4, because a parasitic coupling via the collector-base capacity of the fourth and the fifth transistors T4 and T5 in contrast to a circuit according to FIG. 4 can not be fully excluded. This means that the maximum amplification in the case of a circuit according to FIG. 3 will not be as great as that in the case of a circuit according to FIG. 4. Besides, the input impedance in a circuit according to FIG. 3 can be more readily disturbed or disrupted as in case of a circuit according to FIG. 4.

Also, the circuit which is represented in FIG. 2 is less optimal than the circuit according to FIG. 4, because the collectors of the fourth and the fifth transistors T4 and T5, respectively, are connected directly to the actually low resistive yet HF signal-conducting emitter terminals of the sixth and the seventh transistors T6 and T7. Thereby, the parasitic-acting admittance of the collector terminals of the fourth and the fifth transistors T4 and T5, respectively, affect or influence the HF-amplifier characteristics, with the embodiment according to FIG. 4, in an unfavorable manner when compared.

With regard to the embodiment represented in FIG. 1, it is noted that in comparison with the embodiment according to FIG. 4, the parasitic-acting admittance of the collector terminals of the fourth and fifth transistors T4 and T5, like the embodiments of FIGS. 2 and 3, also act with reduced amplfication on the output signal $U_a$ which appears at the high-resistance output 3 and 4, which, of course, is in contrast with the circuit according to FIG. 4.

There are claimed:

1. Integrable differential amplifier having a d-c voltage source delivering a reference potential and a supply potential wherein a first and a second transistor forming a differential amplifier unit have a respective emitter by which they are connected in common with a collector of a third transistor, the first and second transistors having respective base terminals forming respective signal input terminals and being connected via a respective resistance to a common first auxiliary potential, the first transistor and the second transistor having respective collectors, each of which, through the intermediary of a ballast resistance connected to the supply potential and a terminal appertaining to the ballast resistance of the respective first and second transistors, being directly connected, respectively, to a signal output terminal of the amplifier, the respective emitters of the first and second transistors being connected to the reference potential via the emitter of the third transistor, the third transistor having a base to which a second auxiliary potential is applied, comprising a fourth and a fifth transistor having respective emitters connected together with the emitter of the third transistor to the reference potential via a respective constant current source, said fourth and said fifth transistors having respective bases to which a control signal related to the reference potential is applied in common, said emitter of said fourth transistor and said emitter of said fifth transistor being connected to the emitter of the third transistor, said fourth and said fifth transistors having respective collectors which, with respect to a respective branch of the differential amplifier unit controlled by the collector of the first transistor and by the second transistor, respectively, are connected in such manner to the differential amplifier unit that a current flowing through the ballast resistance associated with the first transistor is affected by a collector current of said fourth transistor, and that a current flowing through the ballast resistance associated with the second transistor is affected by a collector current of said fifth transistor, said collectors of said fourth and said fifth transistors having no direct connection with the connected emitters of the first and second transistors, a sixth transistor via which the collector of the first transistor is connected to an output terminal of the differential amplifier unit associated therewith, and a seventh transistor via which the collector of the second transistor is connected to an output terminal of the differential amplifier unit associated therewith, both of said sixth and said seventh transistors operating in a respective cascode circuit and being controlled by a third auxiliary potential, and a common resistance via which said third auxiliary potential is applied to said sixth and said seventh transistors, respectively.

2. Integrable differential amplifier having a d-c voltage source delivering a reference potential and a supply potential wherein a first and a second transistor forming a differential amplifier unit have a respective emitter by which they are connected in common with a collector of a third transistor, the first and second transistors having respective base terminals forming respective signal input terminals and being connected via a respective resistance to a common first auxiliary potential, the first transistor and the second transistor having respective collectors, each of which, through the intermediary of a ballast resistance connected to the supply potential and a terminal appertaining to the ballast resistance of the respective first and second transistors, being directly connected, respectively, to a signal output terminal of the amplifier, the respective emitters of the first and second transistors being connected to the reference potential via the emitter of the third transistor, the third transistor having a base to which a second auxiliary potential is applied, comprising a fourth and a fifth transistor having respective emitters connected together with the emitter of the third transistor to the reference potential via a respective constant current source, said fourth and said fifth transistors having respective bases to which a control signal related to the reference potential is applied in common, said emitter of said fourth transistor and said emitter of said fifth transistor being connected to the emitter of the third transistor, said fourth and said fifth transistors having respective collectors which, with respect to a respective branch of the differential amplifier unit controlled by the collector of the first transistor and by the second transistor, respectively, are connected in such manner to the differential amplifier unit that a current flowing through the ballast resistance associated with the first transistor is affected by a collector current of said fourth transistor, and that a current flowing through the ballast resistance associated with the second transistor is affected by a collector current of said fifth transistor, said collectors of said fourth and said fifth transistors having no direct connection with the connected emitters of the first and second transistors, a sixth transistor via which the collector of the first transistor is connected to an output terminal of the differential amplifier unit associated therewith, and a seventh transistor via which the collector of the second transistor is connected to an output terminal of the differential amplifier unit associated therewith, both of said sixth and said seventh transistors operating in a respective cascode circuit and being controlled by a third auxiliary potential, and said sixth transistor having a collector connected to said collector of said fourth transistor, and said seventh transistor having a collector connected to said collector of said fifth transistor.

3. Integrable differential amplifier having a d-c voltage source delivering a reference potential and a supply potential wherein a first and a second transistor forming a differential amplifier unit have a respective emitter by which they are connected in common with a collector of a third transistor, the first and second transistors having respective base terminals forming respective signal input terminals and being connected via a respective resistance to a common first auxiliary potential, the first transistor and the second transistor having respective collectors, each of which, through the intermediary of a ballast resistance connected to the supply potential and a terminal appertaining to the ballast resistance of the respective first and second transistors, being directly connected, respectively, to a signal output terminal of the amplifier, the respective emitters of the first and second transistors being connected to the reference potential via the emitter of the third transistor, the third transistor having a base to which a second auxiliary potential is applied, comprising a fourth and a fifth transistor having respective emitters connected together with the emitter of the third transistor to the reference potential via a respective constant current source, said fourth and said fifth transistors having respective bases to which a control signal related to the reference potential is applied in common, said emitter of said fourth transistor and said emitter of said fifth transistor being connected to the emitter of the third transistor, said fourth and said fifth transistors having respective collectors which, with respect to a respective branch of the differential amplifier unit controlled by the collector of the first transistor and by the second transistor, respectively, are connected in such manner to the differential amplifier unit that a current flowing through the ballast resistance associated with the first transistor is affected by a collector current of said fourth transistor, and that a current flowing through the ballast resistance associated with the second transistor is affected by a collector current of said fifth transistor, said collectors of said fourth and said fifth transistors having no direct connection with the connected emitters of the first and second transistors, the first and the second transistors each having a second emitter, said second emitter of the first transistor being connected for driving via said collector of said fourth transistor, and said second emitter of the second transistor being connected for driving via said collector of said fifth transistor.

4. Integrable differential amplifier having a d-c voltage source delivering a reference potential and a supply potential wherein a first and a second transistor forming a differential amplifier unit have a respective emitter by which they are connected in common with a collector of a third transistor, the first and second transistors having respective base terminals forming respective signal input terminals and being connected via a respective resistance to a common first auxiliary potential, the first transistor and the second transistor having respective collectors, each of which, through the intermediary of a ballast resistance connected to the supply potential and a terminal appertaining to the ballast resistance of the respective first and second transistors, being directly connected, respectively, to a signal output terminal of the amplifier, the respective emitters of the first and second transistors being connected to the reference potential via the emitter of the third transistor, the third transistor having a base to which a second auxiliary potential is applied, comprising a fourth and a fifth transistor having respective emitters connected together with the emitter of the third transistor to the reference potential via a respective constant current source, said fourth and said fifth transistors having respective bases to which a control signal related to the reference potential is applied in common, said emitter of said fourth transistor and said emitter of said fifth trasistor being connected to the emitter of the third transistor, said fourth and said fifth transistors having respective collectors which, with respect to a respective branch of the differential amplifier unit controlled by the collector of the first transistor and by the second transistor, respectively, are connected in such manner to the differential amplifier unit that a current flowing through the ballast resistance associated with the first transistor is affected by a collector current of said fourth transistor, and that a current flowing through the ballast resistance associated with the second transistor is affected by a collector current of said fifth transistor, said collectors of said fourth and said fifth transistors having no direct connection with the connected emitters of the first and second transistors, said sixth and said seventh transistors each having two emitters, one of said emitters of said sixth transistor being connected for driving via said collector of said fourth transistor, and one of said emitters of said seventh transistor being connected for driving via said collector of said fifth transistor.

* * * * *